United States Patent
Kawasaki et al.

[11] Patent Number: 5,855,668
[45] Date of Patent: Jan. 5, 1999

[54] SURFACE TREATING METHOD OF SINGLE CRYSTAL

[75] Inventors: Masashi Kawasaki, Kanagawa-ken; Hideomi Koinuma, Tokyo; Kazuhiro Takahashi; Takuzo Yonezawa, both of Kanagawa-ken, all of Japan

[73] Assignee: Kabushiki Kaisha Shinkosha, Tokyo, Japan

[21] Appl. No.: 402,581

[22] Filed: Mar. 13, 1995

[30] Foreign Application Priority Data

| Mar. 25, 1994 | [JP] | Japan | 6-079665 |
| Sep. 17, 1994 | [JP] | Japan | 6-248868 |

[51] Int. Cl.$^6$ .................................................. C30B 31/04
[52] U.S. Cl. ...................................... 117/2; 117/1
[58] Field of Search ............................ 117/1, 2

[56] References Cited

U.S. PATENT DOCUMENTS

| 4,874,741 | 10/1989 | Shaw et al. | 505/1 |
| 5,069,725 | 12/1991 | Fischer et al. | 134/42 |
| 5,356,474 | 10/1994 | Savkar | 118/719 |
| 5,442,585 | 8/1995 | Eguchi et al. | 365/149 |

OTHER PUBLICATIONS

Kawasaki et al, "Atomic Control of the SrTiO$_3$ Crystal Surface," Science vol. 266 pp. 1510–1542, Dec. 2, 1994.

Yoshimoto et al, "Molecular Layer Epitaxy of Perovskite Based Oxides By Laser MBE", Mat. Res. Soc. Symp. vol. 341 pp. 133–138, Jan. 1994.

Norton et al, "Surface Preparation for the heteroepitactic Growth of Ceramic Thin Films", Appl. Phys. Letters vol. 56(22) pp. 2246–2248, May 28, 1990.

Primary Examiner—Robert Kunemund
Attorney, Agent, or Firm—Jordan and Hamburg

[57] ABSTRACT

A surface treating method of single crystals by which single crystals for substrates having finished surfaces showing pit-free and atomic scale step structures are obtained by treating the {100}-plane surfaces of single-crystal SrTiO$_3$ substrates by dissolving two-dimensional-lattice atomic layers forming the surfaces one layer by one layer by using a fluorine-based acidic solution (maintained at >35° C. in temperature and <4 in pH) as a solution A and water as a solution B by alternately immersing the substrates in the substrates in the solution A and B.

66 Claims, 12 Drawing Sheets

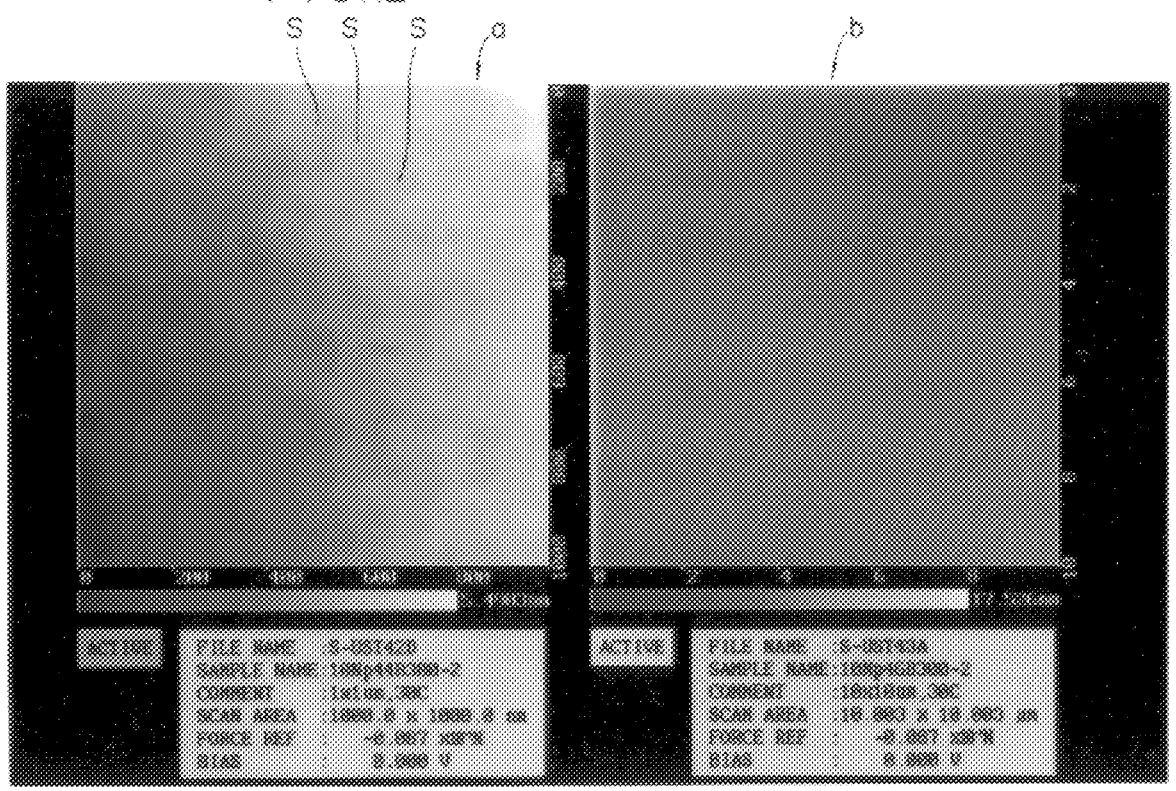

SURFACE TREATING METHOD OF SINGLE CRYSTAL

BACKGROUND OF THE INVENTION

1. Field of the Invention

This invention relates to the surface treating method of single crystals, such as the single-crystal substrates, etc., used for forming superconducting oxide thin films.

2. Statement of the Related Art

A crystal has a three-dimensional internal structure along which atoms are systematically arranged. Bond strengths act between the atoms and molecules constituting the crystal and, because of the bond strengths, the atoms and molecules are systematically arranged in a lattice, resulting in the crystal. Each crystal has its own crystal structure which varies depending upon the crystal system.

Oxide single crystals can be classified into oxide single crystals for optical use, single crystals for substrates used for superconducting thin films, etc., according to their application.

The oxide single crystals for optical use start to attract attention as optical functional elements, the optical communication technology is being developed and researches into the optical computer are in progress.

The single crystals for substrates used for forming superconducting thin films are used in the field of electronics. In the field of electronics, elements utilizing superconductivity are used as Josephon elements represented by the SQUID (high-sensitivity magnetic flux detecting element), superconducting transistors, optical and electromagnetic sensors, etc., and most of the elements are being studied so as to mount them on substrates in the form of thin films. As the research into these elements progress, demands for better substrates are created and, therefore, novel substrates are sought and better treating methods are studied. Recently, many authors reported their research and developed results of single-crystal substrates for thin film elements which are considered to be most quickly put to practical use. For example, bi-crystal substrates have been developed for the SQUID. Single crystals for substrates used for superconducting thin films include $LaAlO_3$ (lanthanum aluminate), $SrTiO_3$, $NdAlO_3$ (neodymium aluminate), $LaGaO_3$ (lanthanum gallate), $NdGaO_3$ (neodymium gallate), $YAlO_3$ (yttrium aluminate), $Nb:SrTiO_3$ (niobium-doped strontium titanate), etc.

The requirements of single crystals for substrates for superconducting thin films are described below:

1. Their lattice constants must be close to those of thin films (crystal structures close to those of thin films are also desirable).
2. Their coefficients of thermal expansion must be close to those of thin films.
3. They should not react to thin films (their constituent elements should not be diffused into thin films).
4. They must not cause phase transition within the working temperature ranges of thin films (from 4.2K to film forming temperatures).
5. They must have small dielectric constants (small dielectric loss tangents (tan δ) are also desirable).
6. High-quality crystals must be obtained.
7. Large-sized substrates must be formed from them.
8. They must be supplied stably (desirably, at low costs).
9. They must be free from surface distortion (deformed layers resulting from treatment).
10. They must have flat surfaces.

Of the above-mentioned requirements, requirements 1 to 5, 6 to 8, and 9 and 10 respectively relate to the characteristics, growing method, and working method of single crystals for substrates.

When the generally used surface treating method using hard abrasive grains, such as those of diamond, etc., is used for the surface finish of single crystals for substrates, the distortion (deformation) of crystal surfaces reaches several to several tens $\mu m$ and such crystals cannot be used for superconducting thin films. Therefore, so-called mechanochemical polishing using soft abrasive grains, such as colloidal silica particles, etc., or chemical polishing which uses chemicals is used for the surface finish or sputter-etching is performed on the surfaces before film formation.

At the time of manufacturing artificial oxide lattices or developing multi-layered devices with the purpose of seeking novel superconducting materials and devices, the surface conditions of the single crystals used for substrates become very important. $SrTiO_3$ single crystals polished by mechanochemical polishing with colloidal silica particles are widely used for forming substrates for superconducting thin films. However, their surfaces have a surface roughness of 3–40 Å in maximum height (P-V) and such roughness is not sufficiently flat to deposit high-quality superconducting thin films.

The purpose of this invention is to provide a surface treating method by which the surfaces of single crystals can be finished to surfaces having small surface roughness or flat surfaces.

The second purpose of this invention is to provide surface treatment by which single crystals having pit-free step structures can be obtained even when surface treating conditions are relaxed.

The third purpose of this invention is to obtain better step structures even under such a treating condition that no pit occurs or pits hardly occur.

SUMMARY OF THE INVENTION

This invention can be classified roughly into a first surface treating method of single crystals including an immersion process and a second surface treating method of surface crystals including a heating process in addition to the immersion process.

In the first method of this invention, the surfaces of single crystals having crystal structures in which two-dimensional-lattice atomic layers of metal oxides repeatedly exist are treated by dissolving the atomic layers forming the surfaces one layer by one layer by using two or more kinds of solutions and by immersing the single crystals in the solutions in order.

In the first method, the surfaces of single crystals having crystal structures represented by the crystal structure of perovskite are treated by dissolving two-dimensional-lattice atomic layers forming the surfaces one layer by one layer by using two or more kinds of solutions and by immersing the single crystals in the solutions in order.

In the first method, the surfaces of single crystals having the crystal structure of perovskite are treated by dissolving two-dimensional-lattice atomic layers one layer by one layer by using two or more kinds of solutions and by immersing the crystals in the solutions in order.

In the first method, the {100}-plane surfaces of single crystals having the crystal structure of perovskite are treated by dissolving two-dimensional-lattice atomic layers forming the surfaces one layer by one layer by using two or more kinds of solutions by immersing the crystals in the solutions in order.

The immersion process for immersing the single crystals in different kinds of solutions can be performed only once, but, in view of improving the effect of surface treatment, it is desirable to repeat the process two or more times.

Single crystals having crystal structures in which two-dimensional-lattice atomic layers of metal oxides repeatedly appear can be represented by those having crystal structures represented by the crystal structure of perovskite. The single crystals having crystal structures represented by the crystal structure of perovskite include those having the crystal structure of perovskite and distorted perovskite crystal structures. For example, $SrTiO_3$ single crystals and $SrTiO_3$ single crystals doped with elements other than Ti and Sr can be included in the single crystal having perovskite crystal structures. The elements other than Ti and Sr can be, for example, Nb (niobium), $LaAlO_3$, $NdAlO_3$, $LaGaO_3$, $NdGaO_3$, and $YAlO_3$ single crystals can be included in the single crystal having distorted perovskite crystal structures.

In the surface treating method of single crystals having the crystal structure of perovskite, such as $SrTiO_3$ single crystals, single crystals having atomically flat surfaces or surfaces in which atomic steps appear can be obtained by etching a two-dimensional-lattice atomic layer forming the surfaces one layer by layers by immersing the crystals in two or more kinds of solutions in order or repeating the immersion process as mentioned above.

In the surface treating method of $SrTiO_3$ single crystals, the {100}-plane surfaces of $SrTiO_3$ single crystals are treated by dissolving two-dimensional-lattice atomic layers forming the surfaces by using two or more kinds of solutions one layer by one layer by immersing the single crystals in the solutions in order.

In the surface treating method of Nb-doped $SrTiO_3$ single crystals, the {100}-plane surfaces of the crystals are treated by dissolving two-dimensional-lattice atomic layers forming the surfaces by using two or more kinds of solutions one layer by one layer by immersing the crystals in the solutions in order.

When a fluorine-based acidic solution and water are used as the solutions in the surface treating method of $SrTiO_3$ single crystals, two-dimensional-lattice atomic layers forming the surface of crystals are etched one layer by one layer by alternately immersing the crystals in the solution and water or repeating the immersion process. Regarding the requirements of each solution, the temperatures of the solution and water can be maintained between about 10° C. and 80° C., but it is specially preferable to maintain the temperature between about 20° C. and 35° C. As the temperature of each solution drops from about 20° C., steps barely start to appear on the treated surfaces and, as the temperature rises to 35° C., pits (etch pits) are apt to occur. While it is preferable to control the pH of the fluorine-based acidic solution between 4 and 5, the allowable range of the pH is from 3 to 6. As the pH becomes lower than 4, pits are apt to occur on the treated surfaces and, when the pH becomes higher than 5, steps barely start to appear. It is preferable that the water used as one of the solutions has a pH between 6 and 8.

With respect to the solutions used for the surface treating method of Nb-doped $SrTiO_3$ single crystals, the purpose of the method can be accomplished even when the same solutions (fluorine-based acidic solution and water), which are used for the surface treatment of $SrTiO_3$ single crystals, are used under the same condition.

When the first surface treating method of single crystals of this invention is used, the surfaces of single crystals can be improved in surface roughness or can be finished in flat surfaces by using two or more kinds of solutions and, when the surface roughness is improved or the surfaces are finished in flat surfaces, the quality of single crystals for substrates, for example, can be improved.

The feature of the second surface treating method of single crystals of this invention is the above-mentioned immersion and heating processes.

The second surface treating method of single crystals of this invention is used for treating the surfaces of single crystals having crystal structures in which two-dimensional-lattice atomic layers of metal oxides repeatedly appear by dissolving the atomic layers forming the surfaces one layer by one layer by using two or more kinds of solutions and includes an immersion process as a treating method of single crystals of this invention is the above-mentioned immersion and heating processes.

The second surface treating method of single crystals of this invention is used for treating the surfaces of single crystals having crystal structures in which two-dimensional-lattice atomic layers of metal oxides repeatedly appear by dissolving the atomic layers forming the surfaces one layer by one layer by using two or more kinds of solutions and contains an immersion process for immersing the single crystals in the solutions in order and a heating process for heat-treating the surfaces of the crystals. The heating process can be performed before, after, or before and after the immersion process.

The second surface treating method of single crystals of this invention is used for treating the surfaces of single crystals having crystal structures represented by the crystal structure of perovskite by dissolving two-dimensional-lattice atomic layers of metal oxide which repeatedly appear by dissolving the atomic layers forming the surfaces one layer by one layer by using two or more kinds of solutions and includes an immersion process for immersing the single crystals in the solutions in order and a heating process for heat-treating the surfaces of the crystals. The heating process can be performed before, after, or before and after the immersion process.

The second surface treating method of single crystals of this invention is used for treating the surfaces of single crystals having the crystal structure of perovskite by dissolving two-dimensional-lattice atomic layers forming the surfaces one layer by one layer by using two or more kinds of solutions and includes an immersion process for immersing the crystals in the solutions in order and a heating process for heat-treating the surfaces of the crystals. The heating process can be performed before, after, or before and after the immersion process.

The second surface treating method of single crystals of this invention is used for treating the surfaces of $SrTiO_3$ single crystals by dissolving two-dimensional-lattice atomic layers forming the surfaces one layer by one layer by using two or more kinds of solutions and contains an immersion process for immersing the crystals in the solutions in order and a heating process for heat-treating the surfaces of the crystals. The heating process can be performed before, after, or before and after the immersion process.

The second surface treating method of single crystals of this invention is used for treating the surfaces of $SrTiO_3$ single crystals doped with elements other than Ti and Sr by dissolving the two-dimensional-lattice atomic layers forming the surfaces one layer by one layer by using two or more kinds of solutions and includes an immersion process for immersing the crystals in the solutions in order and a heating process for heat-treating the surfaces of the crystals. The heating process can be performed before, after, or before and after the immersion process.

The second surface treating method of single crystals of this invention is used for treating the surfaces of Nb-doped SrTiO$_3$ single crystals by dissolving two-dimensional-lattice atomic layers forming the surfaces one layer by one layer by using two or more kinds of solutions and includes an immersion process for immersing the crystals in the solutions in order and a heating process for heat-treating the surfaces of the crystals. The heating process can be performed before, after, or before and after the immersion process.

Single crystals having crystal structures in which two-dimensional-lattice atomic layers of metal oxides repeatedly appear are those having crystal structures represented by the crystal structure of perovskite. The single crystals having crystal structures represented by the crystal structure of perovskite are represented by those having the crystal structure of perovskite and those having a distorted perovskite type crystal structure. The single crystals having the crystal structure of perovskite include single crystals of SrTiO$_3$ and SrTiO$_3$ single crystals doped with elements other than Ti and Sr. The elements other than Ti and Sr can be, for example, Nb (niobium). The single crystals having distorted perovskite crystal structures include single crystals of LaAlO$_3$, NdAlO$_3$, LaGaO$_3$, NdGaO$_3$, YAlO$_3$, etc.

The second surface treating method of single crystals of this invention is used for treating the {1100}-plane surfaces of single crystals having the crystal structure of perovskite by dissolving two-dimensional-lattice atomic layers forming the surfaces one layer by one layer by using two or more kinds of solutions and includes an immersion process for immersing the crystals in the solutions in order and a heating process for heat-treating the surfaces of the crystals. The heating process can be performed before, after, or before and after the immersion process.

The second surface treating method of single crystals of this invention is used for treating the {100}-plane surfaces of SrTiO$_3$ single crystals by dissolving two-dimensional-lattice atomic layers forming the surfaces one layer by one layer by using two or more kinds of solutions, solutions A and B, and an immersion process for immersing the crystals in the solutions A and B in order and a heating process for heat-treating the surfaces of the crystals. The heating process can be performed before or after the immersion process. The solution A can be, for example, a fluorine-based acidic solution, etc., and the solution B can be, for example, water.

The second surface treating method of single crystals of this invention is used for treating the {100}-plane surfaces of SrTiO$_3$ single crystals by dissolving two-dimensional-lattice atomic layers forming the surfaces one layer by one layer by using a fluorine-based acidic solution (solution A) with pH <4 and water (solution B) and an immersion process for immersing the crystals in the solutions A and B in order and a heating process for heat-treating the surfaces of the crystals. The heating process is performed for one or more hours at 900° C. or more before the immersion process. The temperatures of the solutions A and B are maintained at >35° C.

The second surface treating method of single crystals of this invention is used for treating the {100}-plane surfaces of SrTiO$_3$ single crystals by dissolving two-dimensional-lattice atomic layers forming the surfaces one layer by one layer by using two kinds of solutions, solutions A and B, and an immersion process for immersing the crystals in order and a heating process for heat-treating the surfaces of the crystals. The heating process is performed for one or more hours at 900° C. or more after the immersion process and a fluorine-based acidic solution with pH between 4 and 5 is used as the solution A and water with pH between 6 and 8 as the solution B. The temperatures of the solutions are maintained between 20° C. and 35° C. The heating process can be performed before the immersion process so as to surely prevent the occurrence of pits.

The second surface treating method of this invention is used for treating the {100}-plane surfaces of Nb-doped SrTiO$_3$ single crystals by dissolving two-dimensional-lattice atomic layers forming the surfaces one layer by one layer by using a fluorine-based acidic solution (solution A) with pH <4 and contains an immersion process for immersing the crystals in solutions in order and a heating process for heat-treating the surfaces of the crystals. The heating process is performed for one or more hours at ≧900° C. before the immersion process and the temperatures of the solutions A and B are maintained at >35° C.

The second surface treating method of single crystals of this invention is used for treating the {100}-plane surfaces of Nb-doped SrTiO$_3$ single crystals by dissolving two-dimensional-lattice atomic layers forming the surfaces one layer by one layer by using a fluorine-based acidic solution (solution A) with pH 4 and 5 and water (solution B) with pH between 6 and 8 and contains an immersion process for immersing the crystals in solutions in order and a heating process for heat-treating the surfaces of the crystals. The immersion process is repeatedly performed and the heating process is performed for ≧1 hour at ≧900° C. after the immersion process and the temperatures of the solutions are maintained between 20° C. and 35° C. It is also possible to perform the heating process before the immersion process so as to surely prevent the occurrence of pits.

In this inventions, the heating process is performed before, after, or before and after the immersion process, but the actual timing of the heating process is appropriately decided by taking the treating condition, manufacturing efficiency, etc., into account. Under a condition where it is predicted that pits are apt to occur, for example, the heating process is performed before the immersion process so as to suppress the occurrence of pits and, under another condition where it is considered that pits do not occur, the heating process is performed after the immersion process so as to obtain better step structures. Under a condition where the occurrence of pits is uncertain, the heating process is performed before and after the immersion process.

The heating temperature and heating time of the heating process are decided from the surface annealing effect, manufacturing efficiency, manufacturing cost, ets., of single crystals, but it is desirable to set the heating temperature at 900° C. or more and heating time for 1 hour or more. However, the heating temperature and heating time are specified in corresponding to the treating condition of the immersion process, because the relation between the heating temperature and heating time is relative.

The immersion process for immersing single crystals can be performed only once, but it is also possible to perform the process two or more times, namely, repeatedly.

In the immersion process of the surface treating method of SrTiO$_3$ single crystals, the {100}-plane surfaces of the SrTiO$_3$ single crystals are treated by dissolving two-dimensional-lattice atomic layers forming the surfaces one layer by one layer by using two kinds of solutions by immersing the crystals in the solutions in order. When, for example, a fluorine-based acidic solution and water are used as the solutions in this process, two-dimensional-lattice atomic layers forming the surfaces of single crystals are etched one layer by one layer by immersing the crystals in the acidic solution and water in order or by repeating the immersion process.

In the immersion process of the surface treating method of Nb-doped $SrTiO_3$ single crystals, the {100}-plane surfaces of the crystals are treated by dissolving two-dimensional-lattice atomic layers forming the surfaces one layer by one layer by using two kinds of solutions by immersing the crystals in the solutions in order.

Regarding the conditions set to each solution used in the immersion process, the temperatures of the fluorine-based acidic solution and water can be maintained between about 10° C. and 80° C., but it is specially preferable to maintain them between about 25° C. and 35° C. As the temperatures of the solutions drop from about 20° C., steps barely start to appear on the treated crystals and, as the temperatures rise from about 35° C., pits (etch pits) are apt to occur. Although it is preferable to control the pH of the fluorine-based acidic solution between 4 and 5, it is allowable to maintain the pH between 3 and 6. When the pH becomes lower than 4, pits are apt to occur on the treated surfaces and, when the pH becomes higher than 5, steps barely start to appear on the surfaces. It is also preferable, in addition, to maintain the pH of the water used as one of the solutions between 6 and 8. The actual timing of the heating process against the immersion process, the heating conditions, and the performing number of the immersion process are decided based on these conditions and the conditions of the heating process are limited or relaxed depending upon the actual timing of the heating process.

Regarding the solutions used for the surface treating method of Nb-doped $SrTiO_3$ single crystals, the solutions (fluorine-based acidic solution and water) used for treating the surfaces of $SrTiO_3$ single crystals can be used under the same condition.

When the heating process is performed before the immersion process in a state where the treating conditions are relaxed, step structures which can suppress the occurrence of pits are obtained on the treated surfaces. When the heating process is performed after or before and after the immersion process under such a condition that steps appear, but pits do not occur or hardly occur, undisturbed step structures are obtained on the treated surfaces.

When the second surface treating method of single crystals of this invention is used, the productivity can be improved, because the formation of steps is facilitated and the occurrence of pits is prevented on the treated surfaces eventhough the treating conditions are relaxed when the heating process is added (a) before or after or (b) before and after the immersion process. In addition, the quality of, for example, single crystals for substrates can be improved further, because such a surface that step edges are not disturbed can be obtained even under conditions where steps appear, but pits do not occur.

BRIEF DESCRIPTION OF THE DRAWINGS

This application contains at least one drawing executed in color.

FIG. 12 is the photograph of a picture displayed on a display and showing AFM data obtained from the surface of a single-crystal substrate treated by the first surface treating method of this invention. In this picture, no pit is recognized and steps have disturbed edges.

DESCRIPTION OF THE PREFERRED EMBODIMENTS

The embodiments of the first and second surface treating methods of single crystals of this invention are respectively explained in Examples 1 and 2 and Examples 3 to 6 described below:

EXAMPLE 1

Figure 1:
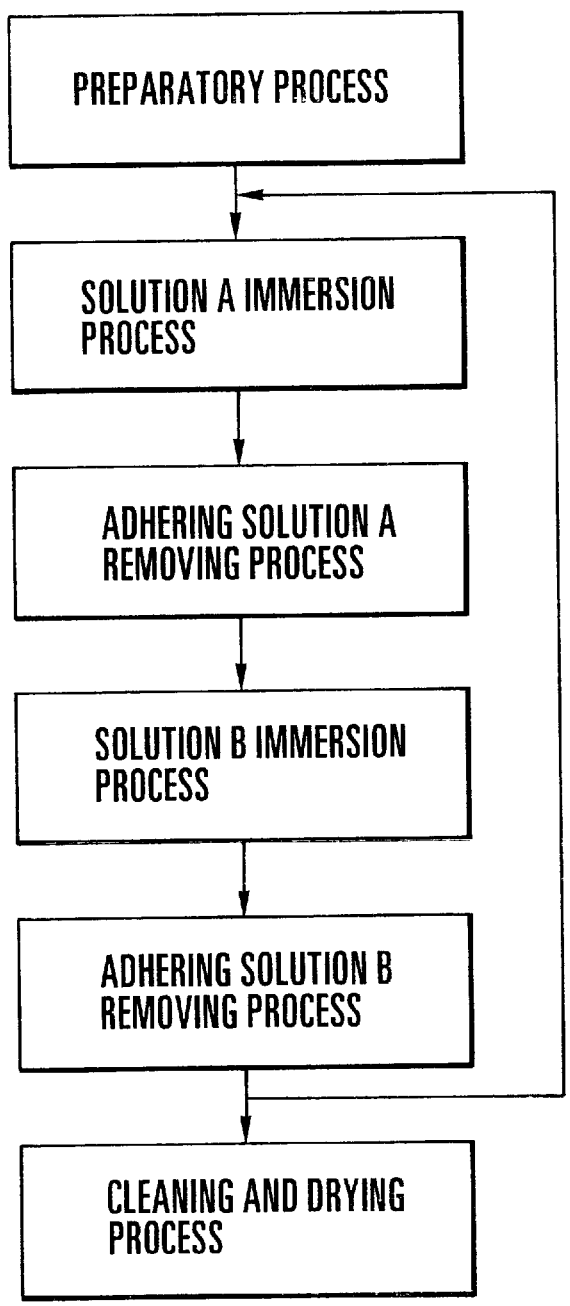
FIG. 1 shows the flow chart used in Example 1 of this invention.

The surface treating method used in this example is explained by referring to FIG. 1.

In this example, a strontium titanate single crystal was selected as the single crystal to be treated and, in addition, a widely used single-crystal strontium titanate substrate having a polished {100}-plane surface was used as the substrate for forming superconducting oxide thin films.

Two kinds of solutions A and B were used for the immersion process and they were maintained at a room temperature (25°–30° C.). The solution A was a mixed solution of hydrofluoric acid (HF) and ammonium fluoride ($NH_4F$) with a pH of 4 and the solution B was ultra pure water (18.3M Ω/cm in specific resistivity).

(1) The solutions A and B were separately in two Teflon containers and the substrate to be surface-treated was housed in a Teflon jig (Preparatory process).

Any kind of material including polypropylene can be used for the containers. Also, any kind of material can be used for the jig.

(2) The jig housing the substrate was first immersed in the solution A for one or more minutes while the jig was rotated (Solution-A immersion process).

(3) After taking out the jig housing the substrate from the solution A, the solution adhering to the substrate and jig was blown off with filtered air (Adhering solution A removing process).

(4) Then the jig housing the substrate is immersed in the solution B for one or more minutes while the jig was rotated (Solution-B immersion process).

(5) After taking out of the jig housing the substrate from the solution B, the water adhering to the substrate and jig was blown off with clean air (Adhering solution B removing process).

(6) The processes from (2) to (5) were repeated two or more times.

(7) Finally, the substrate was cleaned with alcohol and dried with hot air (Cleaning and drying process).

Figure 2:
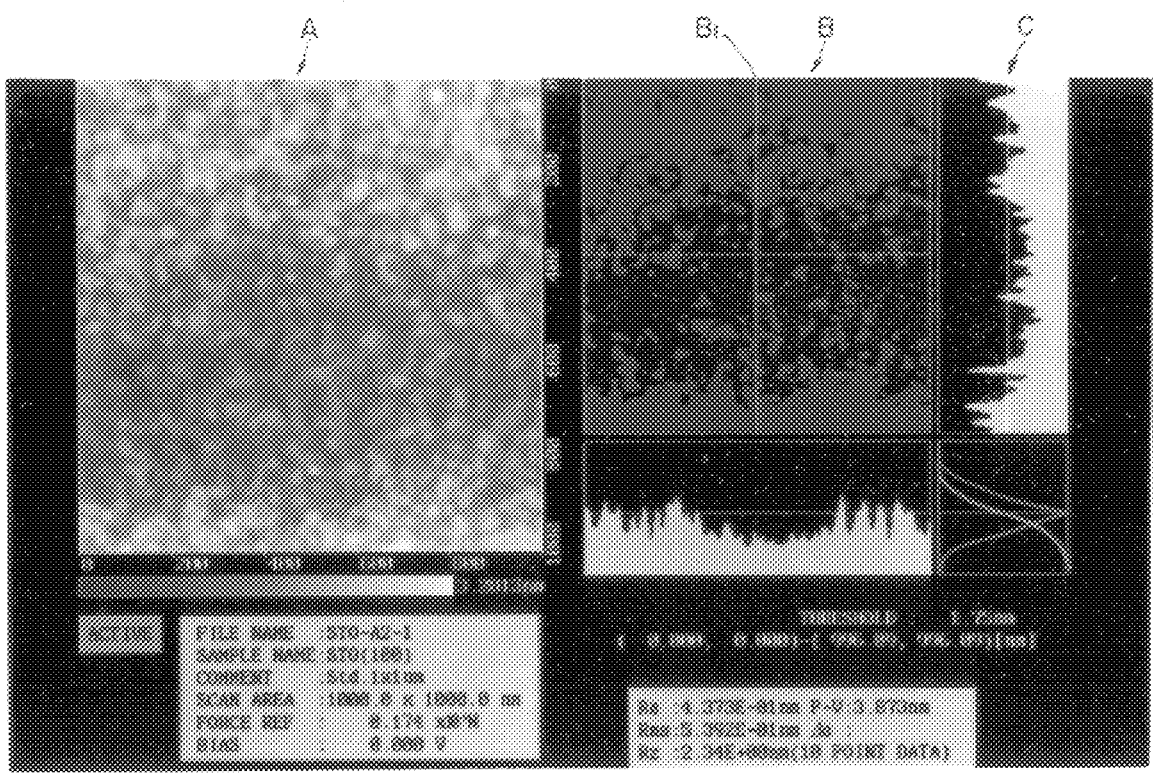
FIG. 2 is a photograph of a picture displayed on a display and showing atomic force microscope (AFM) data obtained from the surface of a single-crystal strontium titanate substrate treated by the Related Art.

The results obtained by the above-mentioned treating method are given below;

FIG. 2 is a picture displayed on a display and AFM (Atomic Force Microscope) data obtained from surface of a single crystal $SrTiO_3$ substrate treating by the surface treating method (hereinafter referred to as "Related Art") specified in the above-mentioned paragraph entitled "Description of the Related Art".

The part A of FIG. 2 is the partially enlarged picture of the of the observed surface displayed on the displayed of the computer. In this picture, the bright and dark colors respectively represent high and low parts on the surface. The brightly colored part represents a high part, and the darkly colored part represents a low part.

B1 in the part B indicates a cross-sectional line. The part C is the cross section of substrate cut along the line B1.

Figure 3:
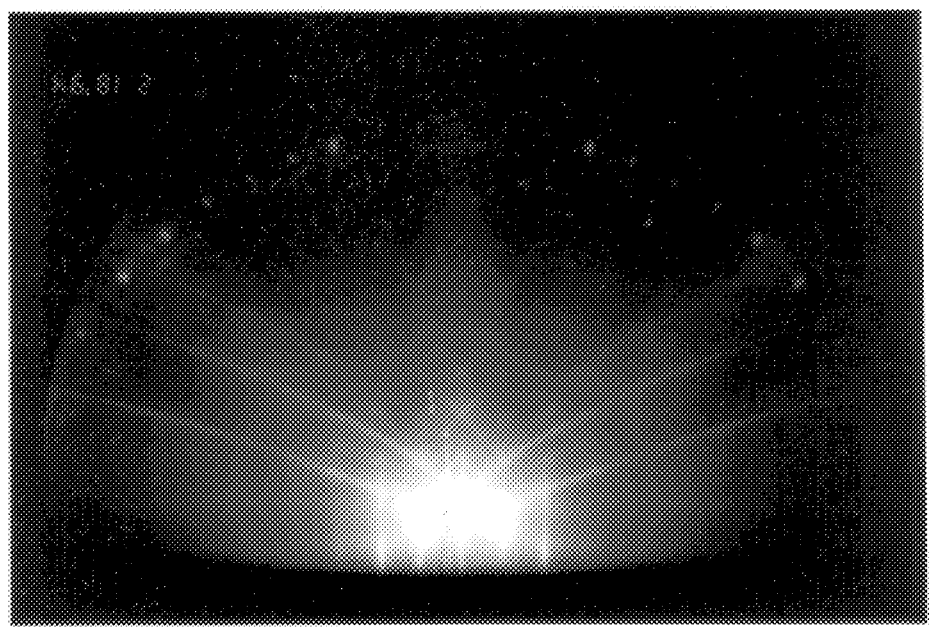
FIG. 3 is a photograph showing the reflection of a high-energy electron diffraction pattern of the surface of a single-crystal strontium titanate substrate treated by the Related Art.

FIG. 3 shows the reflection high-energy electron diffraction (RHEED) pattern of the surface of an $SrTiO_3$ substrate treated by the Related Art. In this picture, vertical streaks are clearly recognized in the primary Laue zone.

Figure 4:
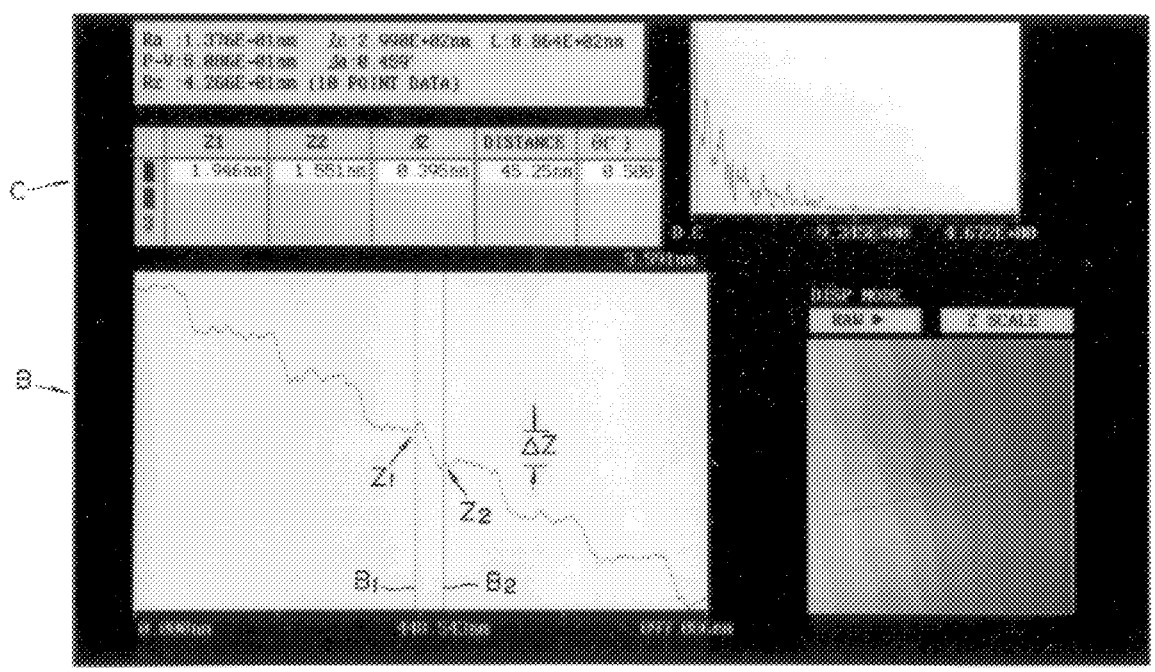
FIG. 4 is the photograph of a picture displayed on a display and showing AFM data obtained from the surface of a single-crystal substrate treated by the surface treating method used in Example 1 of this invention.

FIG. 4 is a picture displayed on a display and showing AFM data obtained from the surface of a substrate treated by the above-mentioned surface treating method. The part A in FIG. 4 is the partially enlarged picture of the observed surface displayed on the display of the computer. The bright and dark colors respectively represent high and low parts on the surface and A1 indicates a cross-sectional line. The part B shows the cross section of the substrate cut along the line A1 and B1 and B2 are markers. In the part B, $\Delta Z$ indicates the difference between points Z1 and Z2 and its value is given in the column C.

Figure 5:
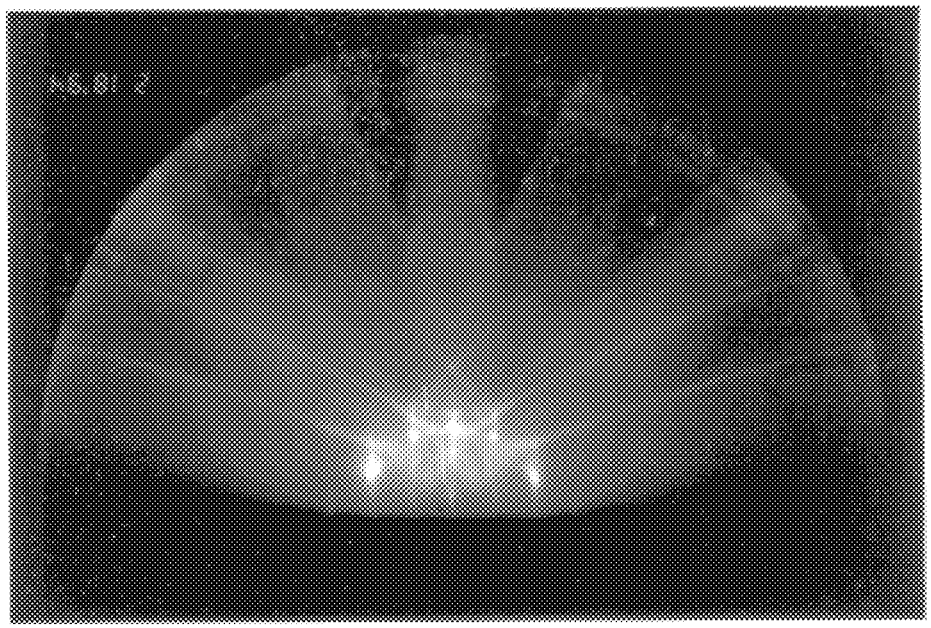
FIG. 5 is a photograph showing the reflection of a high-energy electron diffraction pattern of the surface of a single-crystal substrate treated by the surface treating method used in Example 1 of this invention.

FIG. 5 shows the reflection high-energy electron diffraction pattern of the surface of a substrate treated by the above-mentioned treating method. In this picture, spots are clearly recognized in the primary Laue zone.

As the AFM data shown in FIG. 2 clearly show, the maximum surface roughness of the $SrTiO_3$ substrate treated by the Related Art is about 38 Å in height (P-V: 3.873 nm), whereas the maximum surface roughness of the $SrTiO_3$ substrate treated by the above-mentioned treating method is about or less than 5 Å (P-V: 5.086E-01 nm) as shown in FIG. 4. Consequently, the surface roughness of this substrate is reduced to about or less than 13% of that of the substrate treated by the Related Art.

Therefore, it can be said that the surface roughness of the substrate treated by the above-mentioned surface treating method is flattened in an atomic level. As the part B in FIG. 4 shows, in addition, steps corresponding to the unit lattice length (3.906 Å) of $SrTiO_3$ single crystals can be obtained on the surface of the substrate (refer to column C).

Comparison between reflection high-energy electron diffraction patterns shows that the diffraction image on the primary Laue zone obtained from an untreated substrate is of streaks and that obtained from a treated substrate is of spots (FIG. 4). These results also support the above-mentioned conclusion that the treated surface has atomic-level flatness together with the roughness observed under an atomic force microscope.

As mentioned above, when the above-mentioned surface treating method is used, the surfaces of substrates can be flattened in an atomic level and steps corresponding to the lattice length of $SrTiO_3$ single crystals can be obtained on the treated surfaces.

EXAMPLE 2

In this example, an $SrTiO_3$ single crystal doped with 0.05–1 wt % Nb (niobium) was selected and a substrate for superconducting oxide thin films having a polished (100)-plane surface was used.

In the immersion process of this example, the same solutions as those used in Example 1 were used under the same condition. In addition, the same treating method was also used.

When the surface of the above-mentioned substrate was treated by using the treating method of this example, similar results were obtained.

The above-mentioned first single-crystal surface treating method of this invention is used for treating the surfaces of single crystals, such as $SrTiO_3$ (strontium titanate) single crystals having the crystal structure of perovskite by dissolving two-dimensional-lattice atomic layers one layer by one layer by using two kinds of solutions A and B (for example, solution A is a mixed solution of hydrofluoric acid and ammonium fluoride and solution B is pure water) and features the immersion of the crystals in the solutions in order.

In such a first surface treating method of single crystals, the treating conditions required for the accomplishment of the purpose of the method which is to obtain finished surfaces of single crystals having smaller surface roughness or flat finished surfaces are such that the temperatures of the solutions A and B must be maintained between 20° C. and 35° C. and the pH of the fluorine-based acidic solution and pure water must be controlled to 4–5 and 6–8, respectively. In addition, the immersion process must be repeated.

It has become clear that, depending upon the treating conditions (solution temperatures, number of immersing times, etc.), the surface conditions of treated surfaces are not always consistent. In some cases, steps appear on the treated surfaces of single-crystal substrates, but pits are also apt to occur (In FIG. 11, pits are indicated by the code P) or, in other cases, steps appear in required states, but pits do not or hardly occur.

It is desirable to relax the treating conditions in the above-mentioned example, because it is not preferable that treating conditions have a narrow width, namely, various restrictions from the point of productivity improvement. Therefore, the second treating method has been developed by reforming the first method.

Figure 11:
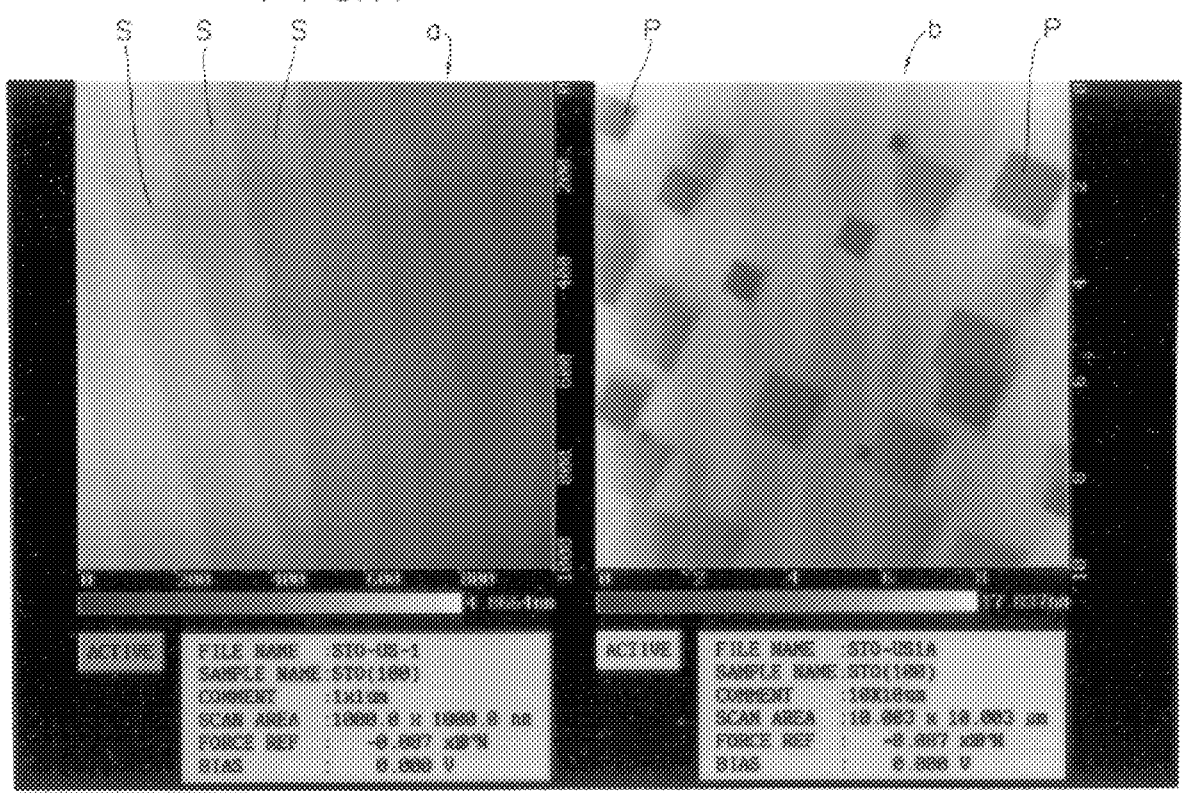
FIG. 11 is the photograph of a picture displayed on a display and showing AFM data obtained from the surface of a single-crystal substrate treated by the first surface treating method of this invention. In this picture, both steps and pits are recognized.

FIG. 11 is the photograph of the partially enlarged picture of the surface of an $SrTiO_3$ substrate showing AFM data displayed on the display of a computer. The picture (a) shows the state of steps appearing within an extent of 1 μm by 1 μm on the treated surface and the bright and dark colors respectively represent high and low parts. In addition, vertical dark and light zones S are continuously seen in the lateral direction. Each zone S is the one called step. The picture (b) shows the state of pits within an extent of 10 μm by 10 μm on the treated surface. Each square one is the one called pit P.

Such an expected result that no pits occur (or pits hardly occur) while steps appear is obtained when the treating conditions are limited. However, when the steps appearing under the limited conditions are observed in detail (FIG. 12), the edges (ridges) of some steps S are not linear like those in FIG. 11, but wavily disturbed.

The picture (b) of FIG. 12 shows no pit.

Examples 3 to 6 are explained below as concrete examples of the second treating method by which better step structures that do not contain such disturbed steps as those shown in FIG. 12 can be obtained.

EXAMPLE 3

In this example, a strontium titanate single crystal was selected as the objective single crystal and, in addition, a widely used single-crystal strontium titanate substrate having a polished {100}-plane surface was used as the substrate for superconducting oxide thin films.

The immersion process was performed by using two kinds of solutions, solutions A and B, with the solution A being a mixed solution of hydrofluoric acid (HF) and ammonium fluoride ($NH_4F$) with a pH <4 and solution B being ultra pure water (specific resistivity: 18.3 Ω/cm). The temperatures of the solutions were maintained at >35° C. higher than the room temperature.

Figure 6:
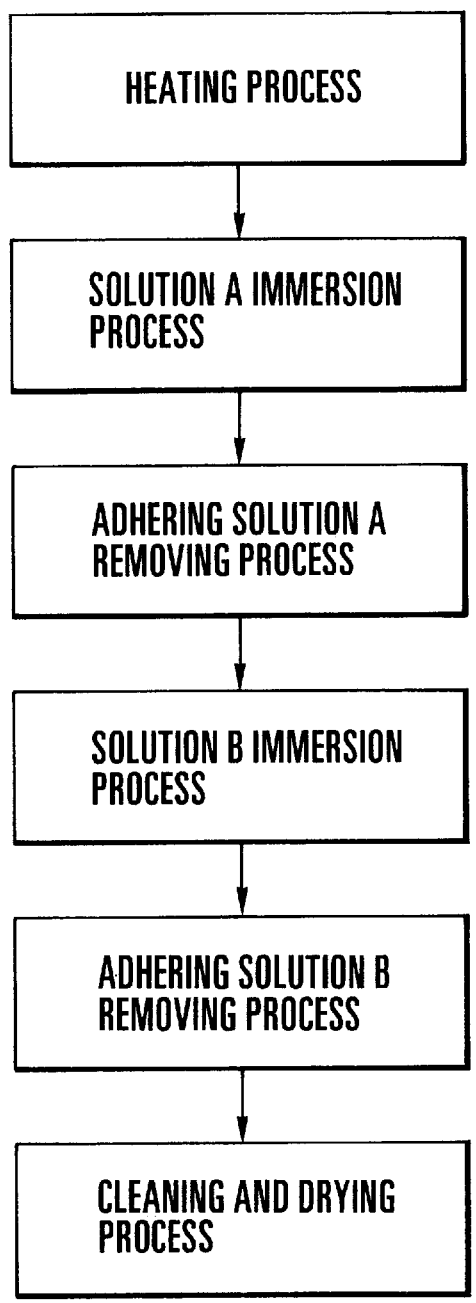
FIG. 6 shows the flow chart used in Example 3 of this invention.

The surface treating process of this example is explained below by referring to FIG. 6:

(1) After setting a jig carrying the substrate to be treated in a furnace, the substrate was heat-treated under a specific condition (Heating process).

The heating process was performed for ≧1 hour at ≧900° C. After heating, the heat-treated substrate was housed in a Teflon jig.

(2) The Teflon jig housing the substrate was immersed in the solution A contained in a Teflon container for ≧1 minute while the jig was rotated (Solution A immersion process).

(3) The jig carrying the substrate was taken out from the solution A and the solution adhering to the substrate and jig was blown off with filtered air (Adhering solution A removing process).

(4) The jig carrying the substrate is immersed in the solution B contained in another Teflon container for ≧1 minute while the jig was rotated (Solution B immersion process).

(5) The jig carrying the substrate was taken out from the solution B and the water adhering to the substrate and jig was blown off with clean air (Adhering solution B removing process).

(6) Finally, the substrate was cleaned with alcohol and dried with hot air (Cleaning and drying process).

Any material including polypropylene can be used for the containers of the solutions A and B and, also, any material can be used for the jis for carrying the substrate.

Figure 9:
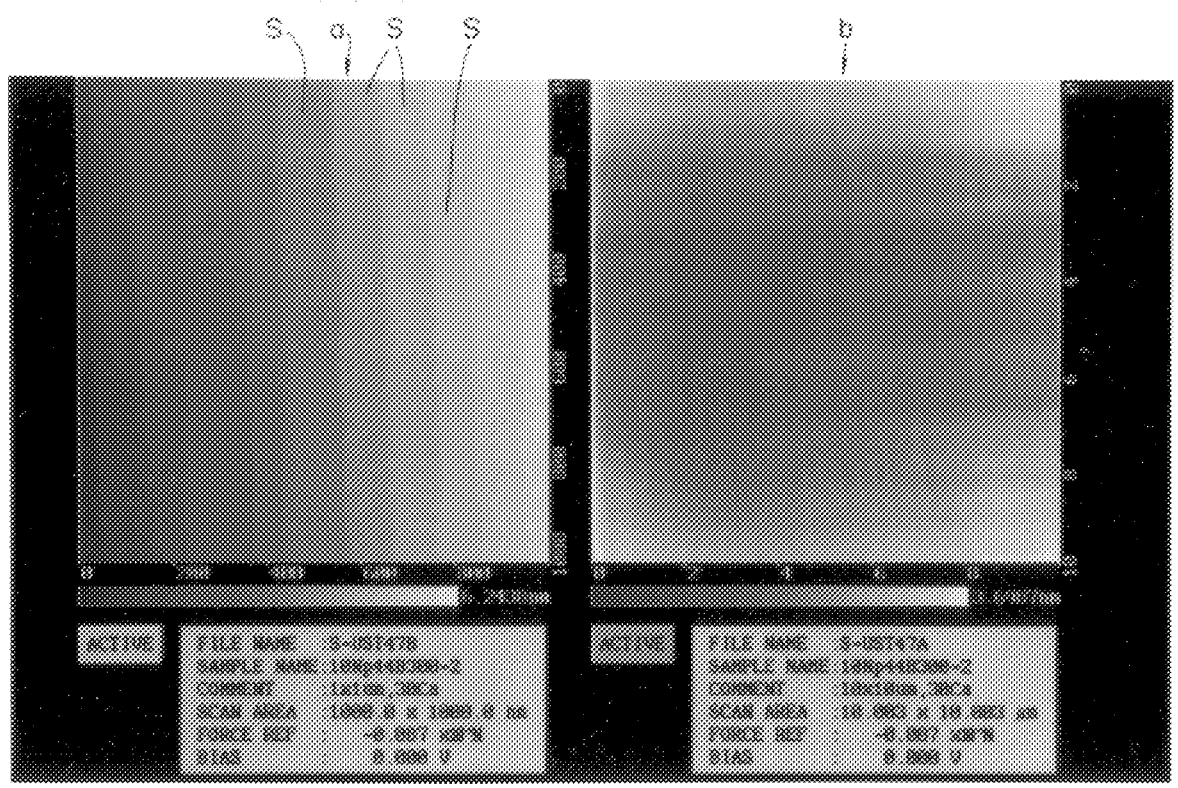
FIG. 9 is a photograph of a picture displayed on a display and showing AFM data obtained from the surface of a single-crystal substrate treated by the surface treating method used in Example 3 of this invention. In this picture, no pit is recognized, but steps are.

The results obtained by the treating method used in Example 3 are described below;

FIG. 9 shows AFM data obtained from the surface of a substrate treated by the treating method used in Example 3. FIG. 9 is the partially enlarged picture of the observed surface displayed on the display of a computer. In FIG. 9, the picture (a) shows the state of steps appearing within an extent of 1 μm on the treated surface and, the bright and dark colors represent high and low parts, and then, vertical dark and light zones are continuously seen in the lateral direction. Each zone is the one called a step. In FIG. 9, b shows the state of pits within an extent of 10 μm on by 10 μm on the treated surface and no pit is recognized.

As understood from FIG. 9, steps S appear on the treated surface, but such pits as those shown in FIG. 11, are not recognized.

As mentioned above, the surface treating method under the treating conditions used in Example 3 can be applied to the treatment of substrate surfaces when the pit-free step structures corresponding to the lattice length of $SrTiO_3$ single crystals are required.

EXAMPLE 4

In this example, the strontium titanate single crystal selected in Example 3 was selected and a widely used single-crystal strontium titanate substrate having a polished (100)-plane surface was used as the substrate for superconducting oxide thin films.

In the immersion process, two kinds of solutions, a mixed solution (solution A) of hydrofluoric acid (HF) and ammonium fluoride ($NH_4F$) with a pH of 4 and ultra pure water (solution B) having specific resistivity of 18.3M Ω/cm, were used at room temperature (25–30° C.).

Figure 7:
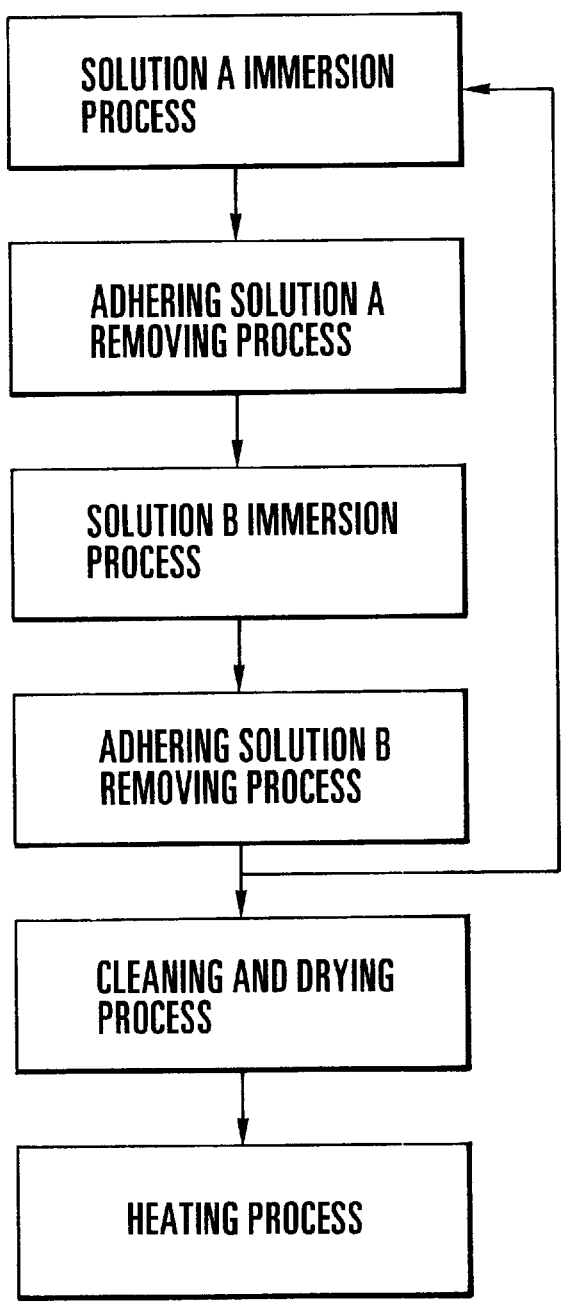
FIG. 7 shows the flow chart used in Example 4 of this invention.
Figure 8:
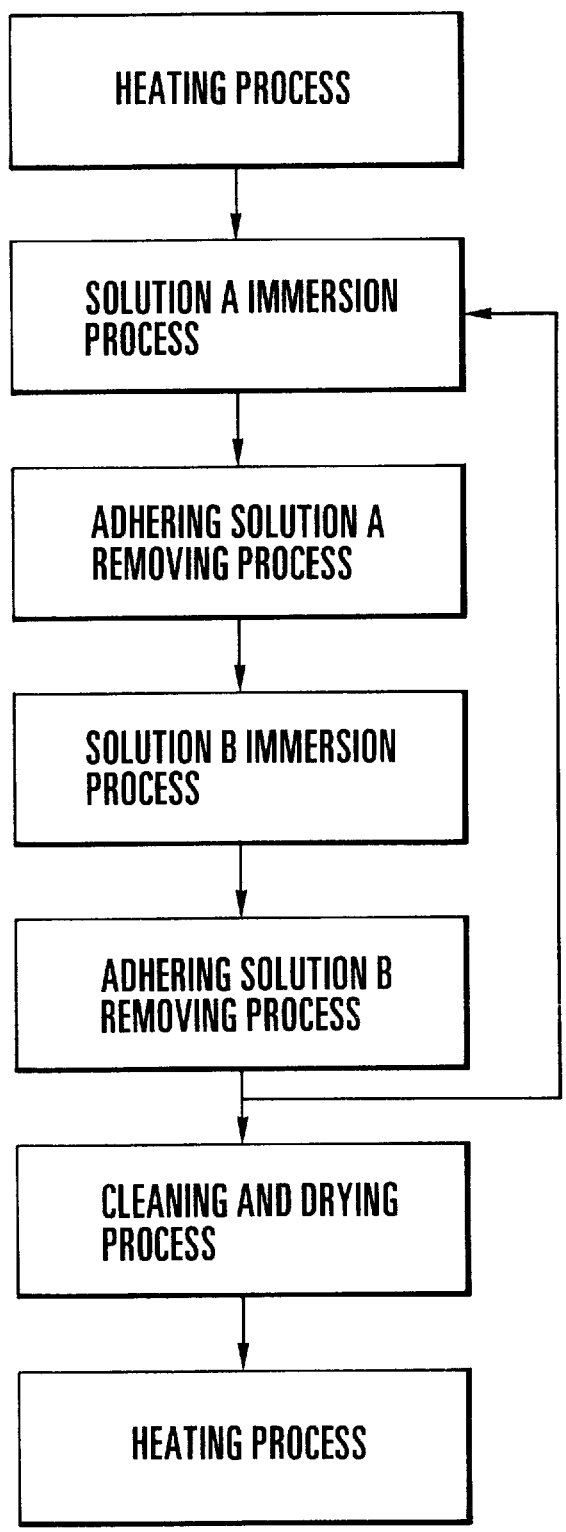
FIG. 8 shows the flow chart used in Example 5 of this invention.

The performed surface treating process is explained below by referring to FIG. 7;

(1) A jig carrying the substrate was immersed in the solution A contained in a Teflon container for one or more minutes while the jig was rotated (Solution A immersion process).

(2) The jig carrying the substrate was taken out from the solution A and the solution adhering to the substrate and jig was blown off with filtered air (Adhering solution A removing process).

(3) The jig carrying the substrate was immersed in the solution B contained in another Teflon container for ≧1 minute while the jig was rotated (Solution B immersion process).

(4) The jig was taken out from the solution B and the water adhering to the substrate and jig was blown off with clean air (Adhering solution B removing process).

(5) The processes (1) to (4) were repeated two or more times.

(6) Then the substrate was cleaned with alcohol and dried with hot air (Cleaning and drying process).

(7) Finally, after the cleaned substrate was put in a jig, the jig was set in a furnace and the substrate was heat-treated for ≧1 hour at ≧900° C. (Heating process).

Figure 10:
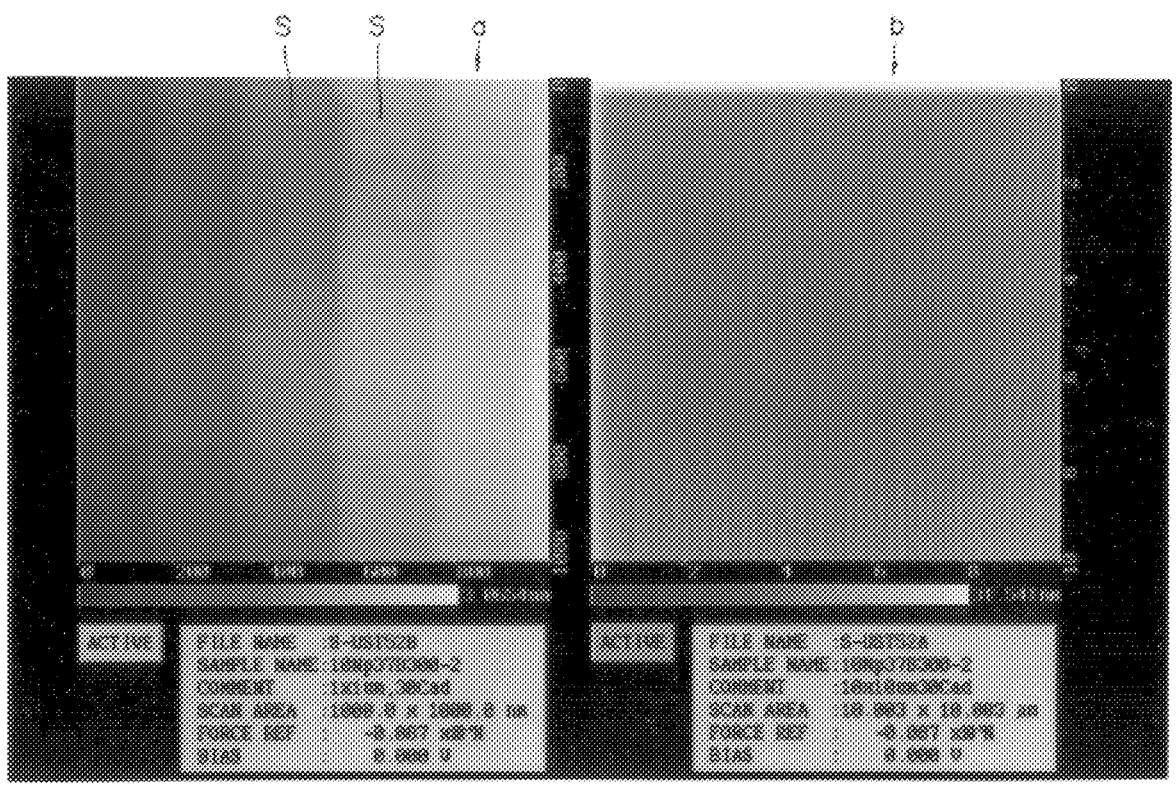
FIG. 10 is the photograph of a picture displayed on a display and showing AFM data obtained from the surface of a single-crystal substrate treated by the surface treating method used in Example 4 of this invention. In this picture, no pit is recognized and, in addition, steps are improved.

The results obtained under the treating conditions used in Example 4 are described below:

FIG. 10 is the photograph of a picture showing the partial enlarged surface of the substrate treated under the above-mentioned conditions together with AFM data. The pictures (a) and (b) of FIG. 10 respectively show the treated surface conditions of the substrate within extents of 1 μm by 1 μm and 10 μm by 10 μm. In picture (a) of FIG. 10, bright and dark colors represent high and low parts and vertical dark and light zones S are continuously recognized in the lateral direction. Each zone is the one called a step. The treated surface in picture (a) of FIG. 10 indicates an improvement in the state of steps, because the edges of the steps are linear as compared with those shown in FIG. 12.

In addition, no pit is recognized in picture (b) of FIG. 12.

As mentioned above, the conditions used in Example 4 can be applied for the surface treatment of substrates when clear step structures corresponding to the lattice length of $SrTiO_3$ single crystals are desired.

Although the treating conditions used in Example 3 were relaxed as compared with those used in Example 4, the occurrence of pits was prevented by performing the heating process before the immersion process. In addition, while the range of the treating conditions used in Example 4 was narrowed as compared with that used in Example 3, a clear step structure was obtained.

EXAMPLE 5

In this example, the heating process was performed before the solution A immersion process by taking the occurrence of pits into account as an exception, while it was expected that, in principle, steps appear but pits do not or hardly occur under the treating conditions used in Example 4. The heating process was performed for $\geq 1$ hour at $\geq 900°$ C. The description of the processes after the heating process is omitted, because they are the same as those performed in Example 4.

EXAMPLE 6

In this example, an $SrTiO_3$ single crystal doped with 0.05–1 wt % Nb was selected and the substrate of this single crystal having a polished {100}-plane was used as the substrate for superconducting oxide thin films.

The heating conditions used in the heating process and the kinds and conditions of the solutions used in the immersion process were the same as those used in Example 3 (or 4). In addition, the same treating method used in Example 3 (or 4) was used. The same results as those obtained in Example 3 (or 4) were obtained in this example.

In addition, the same method as that used in Example 3 can be adopted to substrates for superconducting thin films composed of $SrTiO_3$ single crystals doped with 0.05–1 wt % Nb and having polished {100}-plane surfaces.

What is claimed is:

1. A method for treating the surfaces of single crystals having crystal structures in which two-dimensional-lattice atomic layers of metal oxides repeatedly appear comprising dissolving the atomic layers forming the surfaces one layer by one layer by immersing the single crystals in one solution and then immersing the single crystals in another solution.

2. In the surface treating method of single crystals described in claim 1, the single crystals to be treated have crystal structures represented by the crystal structure of perovskite.

3. In the surface treating method of single crystals described in claim 1, the single crystals to be treated have the crystal structure of perovskite.

4. In the surface treating method of single crystals described in claim 1, the single crystals to be treated are $SrTiO_3$ (strontium titanate) single crystals.

5. In the surface treating method of single crystals described in claim 1, the single crystals to be treated are $SrTiO_3$ single crystals doped with elements other than Ti (titanium) and Sr (strontium).

6. In the surface treating method of single crystals described in claim 5, the element used for doping the $SrTiO_3$ single crystals is Nb (niobium).

7. In the surface treating method of single crystals described in claim 1, the immersion process is repeatedly performed.

8. In the surface treating method of single crystals described in claim 2, the immersion process is repeatedly performed.

9. In the surface treating method of single crystals described in claim 3, the immersion process is repeatedly performed.

10. In the surface treating method of single crystals described in claim 4, the immersion process is repeatedly performed.

11. In the surface treating method of single crystals described in claim 5, the immersion process is repeatedly performed.

12. In the surface treating method of single crystals described in claim 6, the immersion process is repeatedly performed.

13. A surface treating method of single crystals by which the surfaces of single crystals having the crystal structure of perovskite are treated comprising dissolving two-dimensional-lattice atomic layers forming the surfaces one layer by one layer by immersing the crystals in one solution and then in another solution.

14. A surface treating method of single crystals by which the {100}-plane surfaces of single crystals having the crystal structure of perovskite are treated comprising dissolving two-dimensional-lattice atomic layers forming the surfaces one layer by one layer by immersing the crystals in one solution and then in another solution.

15. A surface treating method of single crystals by which the {100}-plane surfaces of $SrTiO_3$ single crystals are treated comprising dissolving two-dimensional-lattice atomic layers forming the surfaces one layer by one layer by immersing the single crystals in one solution and then in another solution.

16. In the surface treating method of single crystals described in claim 15, the immersion process is repeatedly performed.

17. A surface treating method of single crystals by which the {100}-plane surfaces of $SrTiO_3$ single crystals are treated comprising dissolving two-dimensional-lattice atomic layers forming the surfaces one layer by one layer by first immersing the single crystals in a fluorine-based acidic solution and then immersing the single crystals in and by immersing the single crystals in the solutions in order.

18. In the surface treating method of single crystals described in claim 17, the solutions are maintained between 20° C. and 35° C.

19. In the surface treating method of single crystals described in claim 17, the pH of the fluorine-based acidic solution is maintained between 4 and 5.

20. In the surface treating method of single crystals described in claim 17, the pH of the water is maintained between 6 and 8.

21. In the surface treating method of single crystals described in claim 17, the immersion process is repeatedly performed.

22. In the surface treating method of single crystals described in claim 18, the immersion process is repeatedly performed.

23. In the surface treating method of single crystals described in claim 19, the immersion process is repeatedly performed.

24. In the surface treating method of single crystals described in claim 20, the immersion process is repeatedly performed.

25. A surface treating method of single crystals by which the {100}-plane surfaces of $SrTiO_3$ single crystals are treated comprising dissolving two-dimensional-lattice atomic layers forming the surfaces one layer by one layer by first immersing the single crystals in a mixed solution of hydrofluoric solution and ammonium fluoride with a pH<4 and then immersing the single crystals in pure water, the immersion process is repeated while, during the immersion steps the solutions are maintained between 20° C. and 35° C.

26. A surface treating method of single crystals by which the {100}-plane surfaces of Nb-doped $SrTiO_3$ single crystals are treated comprising dissolving two-dimensional-lattice atomic layers forming the surfaces one layer by one layer by first immersing the single crystals in a mixed solution of hydrofluoric solution and ammonium fluoride with a pH of 4 and then immersing the single crystals in pure water, during the immersion process the solutions are maintained between 20° C. and 35° C.

27. A surface treating method of single crystals by which the surfaces of single crystals having crystal structures in which two-dimensional-lattice atomic layers of metal oxides repeatedly appear comprising dissolving the atomic layers one layer by one layer and heating the surfaces of the crystals, the step of dissolving including immersing the crystals in a first solution and then a second solution.

28. In the surface treating method of single crystals described in claim 27, the single crystals to be treated have crystal structures represented by the crystal structure of perovskite.

29. In the surface treating method of single crystals described in claim 27, the single crystals to be treated have the crystal structure of perovskite.

30. In the surface treating method of single crystals described in claim 27, the single crystals to be treated have are $SrTiO_3$ (strontium titanate) single crystals.

31. In the surface treating method of single crystals described in claim 27, the single crystals to be treated are $SrTiO_3$ single crystals doped with elements other than Ti (titanium) and Sr (strontium).

32. In the surface treating method of single crystals described in claim 31, the element used for doping the single crystals is Nb (niobium).

33. In the surface treating method of single crystals described in claim 27, the heating process is performed before the immersion process.

34. In the surface treating method of single crystals described in claim 28, the heating process is performed before the immersion process.

35. In the surface treating method of single crystals described in claim 29, the heating process is performed before the immersion process.

36. In the surface treating method of single crystals described in claim 30, the heating process is performed before the immersion process.

37. In the surface treating method of single crystals described in claim 31, the heating process is performed before the immersion process.

38. In the surface treating method of single crystals described in claim 32, the heating process is performed before the immersion process.

39. In the surface treating method of single crystals described in claim 27, the heating process is performed after the immersion process.

40. In the surface treating method of single crystals described in claim 28, the heating process is performed after the immersion process.

41. In the surface treating method of single crystals described in claim 29, the heating process is performed after the immersion process.

42. In the surface treating method of single crystals described in claim 30, the heating process is performed after the immersion process.

43. In the surface treating method of single crystals described in claim 31, the heating process is performed after the immersion process.

44. In the surface treating method of single crystals described in claim 32, the heating process is performed after the immersion process.

45. In the surface treating method of single crystals described in claim 27, the heating process is performed before and after the immersion process.

46. In the surface treating method of single crystals described in claim 28, the heating process is performed before and after the immersion process.

47. In the surface treating method of single crystals described in claim 29, the heating process is performed before and after the immersion process.

48. In the surface treating method of single crystals described in claim 30, the heating process is performed before and after the immersion process.

49. In the surface treating method of single crystals described in claim 31, the heating process is performed before and after the immersion process.

50. In the surface treating method of single crystals described in claim 32, the heating process is performed before and after the immersion process.

51. In the surface treating method of single crystals described in claim 27, 28, 29, 30, 31, 32, 33, 34, 35, 36, 37, 38, 39, 40, 41, 42, 43, 44, 45, 46, 47, 48, 49, or 50, the heating process is performed for $\geq 1$ hour at $\geq 900°$ C.

52. A surface treating method of single crystals by which the {100}-plane surfaces of single crystals having the crystal structure of perovskite are treated comprising dissolving two-dimensional-lattice atomic layers forming the surfaces one layer by one layer and heating the surfaces of the crystals, the step of dissolving including immersing the crystals in one solution and then in another solution.

53. A surface treating method of single crystals by which the {100}-plane surfaces of $SrTiO_3$ single crystals are treated comprising dissolving two-dimensional-lattice atomic layers forming the surfaces one layer by one layer and heating the surfaces of the crystals, the step of dissolving including immersing the crystals in one solution and then in another solution.

54. In the surface treating method of single crystals described in claim 53, the heating process is performed before the immersion process.

55. In the surface treating method of single crystals described in claim 53, the heating process is performed after the immersion process.

56. In the surface treating method of single crystals described in claim 53, the heating process is performed before and after the immersion process.

57. In the surface treating method of single crystals described in claim 53, a fluorine-based acidic solution and water are used as the two kinds of solutions.

58. In the surface treating method of single crystals described in claim 54, a fluorine-based acidic solution and water are used as the two kinds of solutions.

59. In the surface treating method of single crystals described in claim 55, a fluorine-based acidic solution and water are used as the the two kinds of solutions.

60. In the surface treating method of single crystals described in claim 56, a fluorine-based acidic solution and water are used as the two kinds of solutions.

61. A surface treating method of single crystals by which the {100}-plane surfaces of $SrTiO_3$ single crystals are treated comprising first heating the surfaces of the crystals and then dissolving two-dimensional-lattice atomic layers forming the surfaces one layer by one layer by first immersing the crystals in a fluorine-based acidic with a pH, 4 and then immersing the crystals in water, the step of heating being performed for $\geqq 1$ hour at $\geqq 900°$ C. and the solution and water temperature both being maintained at >35° C.

62. A surface treating method of single crystals by which the {100}-plane surfaces of $SrTiO_3$ single crystals are treated comprising first dissolving two-dimensional-lattice atomic layers forming the surfaces one layer by one layer and then heating crystals, the step of dissolving including immersing the crystals in a first solution of a fluorine-based acidic solution with a pH between 4 and then immersing the crystals in water with a pH between 6 and 8 and repeating the steps of immersing, the step of heating being performed for $\geqq 1$ hour at $\geqq 900°$ C., and the temperature of the first solution and the water being maintained between 20° C. and 35° C.

63. In the surface treating method of single crystals described in claim 62, the heating process is performed before the immersion process.

64. A surface treating method of single crystals by which the {100}-plane surfaces of Nb-doped $SrTiO_3$ single crystals are treated comprising first heating the crystals and then dissolving two-dimensional-lattice atomic layers forming the surfaces one layer by one layer by first immersing the crystals in a fluorine-based acidic solution with a pH<4 and then immersing the crystals in water, the step of heating being performed for $\geqq 1$ hour at $\geqq 900°$ C., and the temperature of both the solution and the water being maintained at >35° C.

65. A surface treating method of single crystals by which the {100}-plane surfaces of Nb-doped $SrTiO_3$ single crystals are treated comprising dissolving two-dimensional-lattice atomic layers forming the surfaces one layer by one layer and then heating the crystals, the step of dissolving including immersing the crystals in a fluorine-based acidic solution with a pH between 4 and 5 and then immersing the crystals in water with a pH between 6 and 8, and repeating the step of dissolving, the step of heating being performed for $\geqq 1$ hour at $\geqq 900°$ C., and the temperature of both the solution and the water being maintained between 20° C. and 35° C.

66. In the surface treating method of single crystals described in claim 65, the heating process is performed before the immersion process.

* * * * *